Nov. 13, 1956 R. H. DICKE 2,770,729

FREQUENCY CONTROL SYSTEM

Filed Nov. 14, 1955

INVENTOR.
ROBERT H. DICKE

BY [signature]

ATTORNEY 2,770,729
Patented Nov. 13, 1956

2,770,729

FREQUENCY CONTROL SYSTEM

Robert H. Dicke, Princeton, N. J.

Application November 14, 1955, Serial No. 546,502
20 Claims. (Cl. 250—36)

This invention relates to a frequency control system, and more particularly to a system for stabilizing the frequency of a microwave oscillator such as a klystron.

The present invention constitutes an improvement over the modulation-demodulation type of frequency stabilization circuit disclosed in Pound Patent No. 2,681,998, dated June 22, 1954. This prior art circuit, which for convenience will be hereinafter referred to as the Pound circuit, utilizes a cavity resonator in a bridge-type frequency discriminator circuit to sense a change in the oscillator frequency.

Because the Pound circuit utilizes a modulator for the detection of bridge unbalance, together with a double detection receiver, the circuit is theoretically very sensitive and should be capable of stabilizing a klystron in frequency with an accuracy of a few cycles per second. In practice, however, the stabilization achieved may be several orders of magnitude poorer. The theory underlying the present invention may be stated as follows: the unexpectedly poor performance of the Pound circuit results from the facts that the bridge frequency discriminator of Pound compares the impedance of the cavity resonator with the impedance of the mixer crystal, and the mixer crystal impedance is not stable. It is known that a crystal rectifier, when operated as a mixer, undergoes low frequency fluctuations in its conversion gain and impedance. In the bridge-type circuit disclosed in the Pound patent, a low frequency fluctuation in the crystal rectifier impedance causes a corresponding fluctuation in the klystron frequency.

An object of this invention is to devise a system for frequency stabilization which gives improved results as compared to the Pound circuit.

Another object is to devise a novel system for the frequency stabilization of klystrons or other microwave oscillators.

A feature of this invention lies in the use of a so-called "magic-T" waveguide assembly connected as a bridge-type frequency discriminator wherein a cavity resonator and a stable passive element (e. g., an absorber) are mounted respectively as impedance comparison elements in the two symmetrical (in-line) branches of this magic-T, and the crystal mixer is coupled to one of the two asymmetrical branches thereof. The crystal mixer is thus located at a position such that it is not used as an impedance comparison element.

Briefly, the objects of the invention are accomplished by utilizing, in conjunction with the aforesaid feature, a modulator crystal in the other of the two asymmetrical branches of the magic-T assembly. The modulator crystal is supplied with energy from an oscillator whose frequency is low compared to that of the oscillator to be stabilized, and energy from the latter oscillator is coupled to the same asymmetrical branch to which the crystal mixer is coupled. Sidebands are developed at the modulator crystal in response to energy from the high frequency oscillator appearing thereat, and these sidebands mix in the mixer crystal with energy from the high frequency oscillator to produce a beat frequency equal to the frequency of the low frequency oscillator. This beat frequency is compared in a phase detector with waves derived directly from the low frequency oscillator, and the phase detector output is used to control the frequency of the high frequency oscillator.

A more detailed description of the invention follows, wtih reference to the accompanying drawing, wherein.

Figure 1:
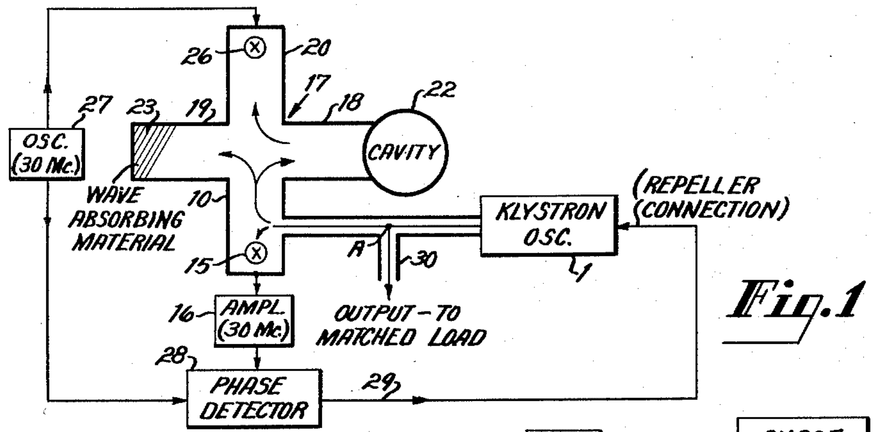
Fig. 1 is a block and schematic diagram illustrating the basic concept of the invention.

Referring first to Fig. 1, the numeral 1 designates a carrier-wave generator, for example a microwave oscillator of the klystron type having a frequency on the order of 10,000 megacycles per second, and whose frequency it is desired to control or stabilize. The carrier-wave output of oscillator 1 is applied to an energy-transmission system including a coaxial line 30, for example. Although coaxial lines are illustrated in Fig. 1, this is done only by way of example, and it is desired to be made clear that waveguide components may be utilized, as will hereinafter be described in connection with Figs. 2 and 3. The line 30 couples oscillatory energy output from the oscillator 1 to a suitable matched load, such as an appropriate antenna system for radiating oscillatory energy developed in oscillator 1. A portion of the microwave output of oscillator 1 is extracted from the energy-transmission system at a point A and is coupled (by means of a probe, for example, although other coupling arrangements can equally well be utilized, as will be described hereinafter in connection with Figs. 2 and 3) into one of the two asymmetrical branches, branch 10, of a so-called "magic-T" waveguide bridge or assembly 17. The magic-T 17 includes three other waveguide branches 18, 19 and 20 extending from a common junction at right angles to each other, and has a physical configuration similar to that shown in Fig. 5 of Bond Patent 2,676,260. Branches 18 and 19 are the two symmetrical branches, and branch 20 is the other one of the two asymmetrical branches, of the magic-T assembly 17.

One 18 of the two symmetrical branches of magic-T 17 is terminated in a cavity resonator 22 designed to be resonant at the selected reference frequency with respect to which it is desired to maintain the frequency of the carrier wave from oscillator 1 in a predetermined, fixed relationship. The predetermined desired frequency of oscillator 1 is preferably the same as the resonant frequency of cavity resonator 22. The other symmetrical branch 19 of magic-T 17 is terminated in a wave absorbing impedance 23 which may be substantially equivalent to the characteristic impedance of the branch 19. A mixer crystal (e. g., crystal rectifier) 15 is coupled to the asymmetrical branch 10 of magic-T 17, and the output connections of crystal 15 are coupled to the input of an intermediate frequency (I. F.) or modulation frequency amplifier 16. The amplifier 16 is tuned to a frequency (e. g., 30 mc./s.) which is low compared to the microwave frequency of oscillator 1. The other asymmetrical branch 20 of magic-T 17 is terminated in a modulator crystal (e. g., a crystal rectifier) 26 to which is applied the relatively low frequency output of a modulation frequency oscillator (having a frequency of 30 mc., for example) which is intended to modulate any microwave power arriving at the crystal 26 by way of the branch 20.

The output of the mixer crystal 15 is applied to the modulation-frequency amplifier 16 which is tuned to the frequency of the modulation oscillator 27, and the output of said amplifier is applied as one input to a phase detector 28 which has two inputs and one output. The other input to detector 28 comprises a portion of the output of modulation oscillator 27, so it may be said that detector 28 is receptive of a portion of the output of oscillator 27. The combination of the modulation-frequency amplifier 16 output and the modulation oscillator 27 output in phase detector 28 results in a unidirectional (direct current or D. C.) output (at detector output lead 29) which is applied to the frequency control means of oscillator 1. If an oscillator of the reflex klystron type is used at 1, it may be tuned over a relatively narrow band of frequencies by applying the output of phase detector 28 directly to the reflector or repeller electrode of the klystron. Then, the detector output lead 29 would be directly connected to the klystron repeller connection, as indicated in Fig. 1.

According to this invention, the oscillator 1 is controlled in frequency by voltage from the phase detector 28. The output of the detector 28 is made to depend on the output of the oscillator 27 and the amplifier 16. The latter is frequency sensitive to the output of oscillator 1. The operation of the circuit may be described in some detail as follows:

The cavity resonator 22 is approximately matched to the impedance of the waveguide branch 18 at the desired frequency of operation of klystron 1 (which is also the resonant frequency of the cavity). The impedance presented by cavity 22 varies with the frequency of the wave energy applied thereto.

The carrier wave or carrier signal from microwave oscillator 1 arriving at branch 10 of the magic-T 17 splits into two parts, one part traveling along branch 10 toward the mixer crystal 15 and the other part traveling along branch 10 toward the magic-T 17. This causes some klystron frequency wave energy (microwave carrier energy) to appear at mixer crystal 15.

After some attenuation in branch 10, the microwave carrier signal flowing along this branch toward magic-T 17 arrives thereat and it is divided, one half going toward the cavity resonator 22 and the other half toward the absorbing impedance or stable passive wave impedance element 23. Element 23 may be a wave absorbing strip, for example, of more or less conventional and well-known construction, made of powdered iron or graphite, for example.

The stable passive element 23 serves as the stable-impedance comparison element for cavity resonator 22. Element 23 is not frequency-sensitive and is matched at all frequencies so that it absorbs the microwave power fed thereto, and thus there is no reflection back along branch 19. If the resonator 22 is matched to the waveguide branch 18 it does not reflect at the resonant frequency. However, if the bridge is unbalanced to any extent (due to the frequency of microwave oscillator 1 being on either side of the resonant frequency of cavity 22) a fraction of the microwave carrier signal is reflected from a cavity 22 because of its mismatch at this frequency, and this reflected signal divides into the modulator crystal branch 20 and the input branch 10. The bridge is unbalanced at this latter frequency because the impedances 22 and 23, which are compared by the bridge, are not equal at such frequency. The portion of the reflected signal traveling along the input branch 10 suffers attenuation therein.

Thus, any unbalance results in microwave carrier power arriving at the modulator crystal 26. Crystal 26 is so mounted that if its I. F. terminals are short-circuited it is matched, and causes no reflection of incident energy. Under this condition of mounting the application of a large I. F. voltage (from modulating I. F. oscillator 27) to the terminals of crystal 26 causes it to reflect during the presence of voltage across its terminals in approximately opposite phase for opposite polarities of instantaneous voltage. That is to say, the microwave impedance of crystal 26 is modulated approximately symmetrically at the I. F. This is equivalent to the generation of two side frequencies, one at the microwave frequency plus the I. F. and the other at the microwave frequency minus the I. F. In other words, the microwave carrier power arriving at the modulator crystal 26 is amplitude modulated. The instantanous microwave phase of the two amplitude modulation side frequencies is determined by the phase of the incident microwaves from which they are generated.

The amplitude modulation side frequency waves travel back to the magic-T 17 along branch 20. At magic-T 17 they are split, one part of each traveling to stable passive element 23 (where they are absorbed) and the other part to the cavity resonator 22. Because of the frequency sensitivity of the impedance of the cavity resonator, mismatch occurs at the amplitude modulation side frequencies (which are different from the carrier frequency), and such side frequencies thus find the bridge unbalanced. The amplitude modulation side frequencies are therefore reflected from cavity resonator 22 and will again enter the magic-T 17 and will thence be split, part going into branch 10 and the rest into branch 20. The part traveling along branch 20 will travel into modulator crystal 26, where two more side frequencies will be generated by each original side frequency.

The reflected amplitude modulation side frequency waves traveling along branch 10 will reach mixer crystal 15. The amplitude modulation side frequencies are mixed with the klystron frequency (microwave carrier frequency) in mixer crystal 15. Since the side frequencies differ by the modulation frequency (30 mc.) from the carrier frequency, the mixing of carrier and side frequencies in mixer 15 produces a 30-mc. I. F. beat signal output. This resulting 30-mc. I. F. signal is applied to the input of modulation frequency amplifier 16, which is tuned to 30 mc.

At the crystal mixer 15, there is produced either a substantially zero-value or finite-value beat frequency (30 mc.) resultant wave, depending upon whether the frequency of the carrier wave output of oscillator 1 has drifted from the desired condition of equality with the cavity resonator frequency, and if it has drifted, the finite-value beat frequency resultant wave will have a phase, relative to that of the initially applied modulation, at 27, and a magnitude, depending respectively on the direction and magnitude of the drift.

If the oscillator 1 has the correct frequency (the resonant frequency of cavity resonator 22), no microwave carrier signal is reflected from resonator 22, so that none reaches the modulator crystal 26 and no amplitude modulation side frequencies are produced. Since no side frequencies are produced in this case, none can reach mixer crystal 15 and no I. F. beat signal output is produced thereby. This is true if the bridge balance condition is reached, which may not be the case in actual practice.

The amplified I. F. signal output (30 mc.) of amplifier 16 is applied as one of the two inputs to phase detector 28. The latter is also receptive of a portion of the output of the I. F. modulation oscillator 27 (30 mc.). The combination of the modulation-frequency amplifier 16 output and the modulation oscillator 27 output in detector 28 results in a unidirectional output whose polarity and magnitude likewise depend, respectively, on the sense and magnitude of any deviation from the fixed relationship (equality) between the frequency of the carrier wave output of oscillator 1 and the selected reference frequency (resonant frequency of resonator 22).

The unidirectional output of detector 28 is an automatic frequency control voltage which controls the reflector electrode or repeller electrode potential of klystron oscillator 1, in such a way as to adjust the oscillator frequency for nearly zero 30-mc. I. F. signal out of mixer crystal 15, or to substantially compensate for any drift in the frequency of the carrier wave oscillator 1. The resulting null (in the output of detector 28) is not necessarily a bridge balance, but is rather a phase null, for which the signal into the mixer 15 constitutes a phase modulation, rather than an amplitude modulation with its side frequencies.

Figure 2:
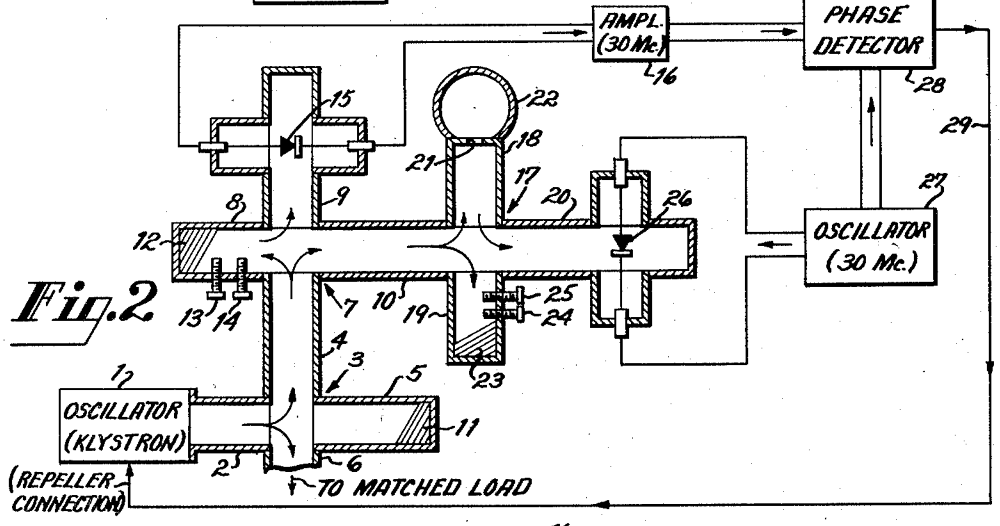
Fig. 2 is a partial block, partial schematic diagram of a frequency control system assembled in accordance with the principles of the present invention, as it might be built in actual practice.

Fig. 2 discloses a system according to the present invention, as it might be built in actual practice. In Fig. 2, the mixer crystal 15 is coupled to the asymmetrical branch 10 of the waveguide bridge 17 somewhat differently from the way in which it is coupled thereto in Fig. 1, and in Fig. 2 the microwave oscillator 1 is coupled to the waveguide bridge 17 somewhat differently from the way in which it is coupled thereto in Fig. 1.

In Fig. 2, the carrier-wave output of klystron oscillator 1 is applied to an energy-transmission system including a waveguide section 2 which constitutes one of the two asymmetrical branches of a so-called "magic-T" 3 including also three other waveguide branches 4, 5 and 6 extending from a common junction at right angles to each other.

One 6 of the two symmetrical branches of magic-T 3 is terminated in any desired matched load, such as an appropriate antenna system for radiating a portion of the energy developed by the oscillator 1, and the other symmetrical branch 4, which is receptive of another portion of said energy, constitutes one of the two asymmetrical branches of a so-called "magic-T" 7 including also three other waveguide branches 8, 9 and 10 extending from a common junction at right angles to each other.

The other asymmetrical branch 5 of magic-T 3 is terminated in its characteristic impedance by means of a suitable wave impedance 11 positioned therein. Impedance 11 may be a wave absorbing strip of more or less conventional and well-known construction.

One 8 of the two symmetrical branches of magic-T 7 is terminated in a wave absorbing impedance 12 which may be substantially equivalent to the characteristic impedance of the branch, and a pair of impedance adjusting screws 13 and 14 are positioned in branch 8, for a purpose which will later become apparent. The other asymmetrical branch 9 of magic-T 7 is terminated in a mixer crystal (e. g., a crystal rectifier) 15 whose output connections are coupled to the input of the I. F. (modulation frequency) amplifier 16.

The other symmetrical branch 10 of magic-T 7 constitutes one of the two asymmetrical branches of the magic-T waveguide bridge 17. Since the mixer crystal 15 is in the magic-T 7 one of whose branches 10 is one asymmetrical branch of waveguide bridge 17, said crystal is coupled to the asymmetrical branch 10 of the magic-T assembly 17. Cavity resonator 22 is coupled to one symmetrical branch 18 of magic-T 17 through an iris 21.

A pair of impedance adjusting screws ("bridge balance" screws) 24 and 25 are positioned in the branch 19 of magic-T 17. In the operation of Fig. 2, these impedance matching or adjusting screws 24 and 25 are adjusted for an approximate balance of the bridge 17 at resonance (the resonant frequency of resonator 22).

The carrier wave signal from microwave oscillator 1 arriving at the magic-T 3 through waveguide section 2 splits into two parts, one part traveling to the load by way of branch 6 and the other part traveling toward magic-T 7 by way of branch 4. Due to the provision of matched impedance 11 and due also to the fact that branch 5 is an asymmetrical branch of the magic-T, no appreciable energy reflection occurs in branch 5.

After some attenuation in branch 4, the carrier signal flowing along this branch arrives at the magic-T 7 and it there splits, one half going along branch 8, and the other half going along branch 10 toward the magic-T 17. The screws 13 and 14 are adjusted so that the branch 8 is mismatched in impedance somewhat. This mismatch causes some of the microwave carrier signal to be reflected back along branch 8 to magic-T 7 where it splits, one half traveling along branch 9 toward the mixer crystal 15 and the other half traveling along branch 4 to an attenuator which may be positioned therein. This causes some klystron frequency wave energy (microwave carrier energy) to appear at mixer crystal 15. By the proper adjustment of screws 13 and 14, both the amplitude level and the phase of this microwave carrier energy appearing at mixer crystal 15 may be controlled.

The microwave carrier signal going along branch 10 toward the magic-T 17 is attenuated somewhat in this branch but when it reaches magic-T 17 it is divided, just as is the case with the carrier signal flowing along branch 10 toward magic-T 17 in Fig. 1. The action from here on is just the same as previously described in connection with Fig. 1. If the bridge is unbalanced a fraction of the microwave carrier signal is reflected from cavity 22 because of its mismatch at the unbalance frequency, and this reflected signal divides into the modulator crystal branch 20 and the input branch 10. The portion of the reflected signal traveling along the input branch 10 suffers attenuation before it gets back to waveguide section 2, and the coupling between waveguide section 2 and branch 4 is small in any event.

Just as in Fig. 1, any unbalance results in microwave carrier power arriving at the modulator crystal 26, and amplitude modulation side frequency waves are produced therein due to the action of the I. F. oscillator 27. The amplitude modulation side frequencies are reflected from cavity resonator 22 because of its mismatch at these frequencies. These reflected amplitude modulation side frequency waves again enter the magic-T to thence be split, part going into branch 10 and the rest into branch 20.

The reflected amplitude modulation side frequency waves traveling along branch 10 will reach magic-T 7 and be split, part traveling along branch 4 to the attenuator which may be therein and the rest traveling along branch 9 to the mixer crystal 15. The amplitude modulation side frequencies are mixed with the klystron frequency in mixer crystal 15, the mixing of carrier and side frequencies in mixer 15 producing a 30-mc. I. F. beat signal output, just as in Fig. 1. This resulting 30-mc. I. F. signal is applied to the input of the 30-mc. tuned amplifier 16, and the operation from this point on is exactly the same as in Fig. 1.

Figure 3:
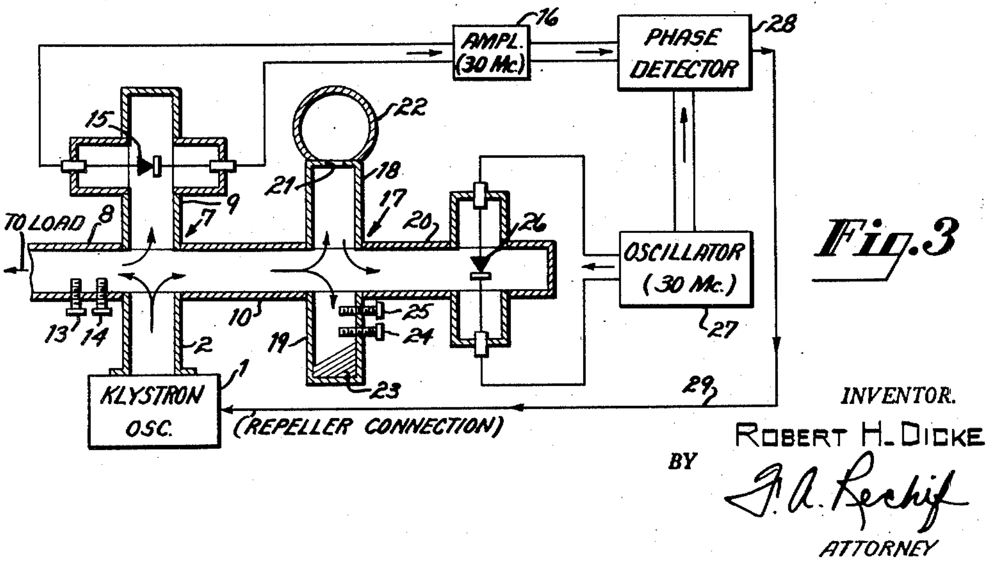
Fig. 3 is a partial block, partial schematic diagram of a modified arrangement, as it might be built in actual practice.

Fig. 3 discloses a modified arrangement as it might be built in actual practice, in which one 3 of the three magic-T's of Fig. 2 is dispensed with. In Fig. 3, just as in Fig. 2, elements the same as those of Fig. 1 are denoted by the same reference numerals. In Fig. 3, waveguide section 2 (which carries the carrier-wave energy output of oscillator 1) constitutes one of the two asymmetrical branches of a magic-T 7 including also the three other waveguide branches 8, 9 and 10 extending from a common junction at right angles to each other. One 8 of the two symmetrical branches of magic-T 7 is terminated in any desired load, such as an appropriate antenna system, and the impedance adjusting screws 13 and 14 are again located in this branch. The remainder of the circuit is the same as in Fig. 2.

In the operation of Fig. 3, the carrier signal from oscillator 1 arriving at the magic-T 7 through waveguide section 2 splits into two parts, one part traveling to the load by way of branch 8 and the other part traveling toward magic-T 17 by way of branch 10. The screws 13 and 14 are adjusted to provide a slight mismatch, so that some of the microwave carrier frequency signal is reflected from branch 8 and travels to mixer crystal 15, to there be mixed with the amplitude modulation side frequencies developed if oscillator 1 is off frequency, just as in Fig. 2. The remainder of the operation of the Fig. 3 circuit is exactly the same as that of the Fig. 2 circuit, so the description thereof will not be repeated.

Although magic-T waveguide assemblies have been illustrated as being utilized for the diplexers or hybrid coupling units 17 in Fig. 1, 3, 7 and 17 in Fig. 2, and 7 and 17 in Fig. 3, it is desired to point out that other types of diplexers or hybrid units can equally well be utilized in these locations. For example, waveguide or coaxial ring-type radio frequency circuits, or directional couplers, can be utilized. Some diplexers which can be utilized are illustrated in Bond et al., Patent No. 2,676,260, dated April 20, 1954, and others are described in an article entitled "Hybrid Circuits for Microwaves," Proceedings of the IRE, vol. 35, page 1294, November 1947.

Although the system of this invention has been illustrated and described in connection with the stabilization of a klystron oscillator, other types of oscillators, such as triode oscillators, can be stabilized by the use of the system of the invention. Such other oscillators could be stabilized, for example, by utilizing the output of the phase detector to control the B+ voltage applied to the oscillator, or applying the phase detector output to a reactance tube coupled to the oscillator.

What is claimed is:

1. In an oscillator frequency control system, an oscillator the frequency of which is to be controlled, an impedance bridge type frequency discriminator comprising a magic-T assembly having two symmetrical waveguide branches and two asymmetrical waveguide branches, a passive wave impedance element terminating one of said two symmetrical branches, a cavity resonator coupled to the other of said two symmetrical branches, said resonator being matched to said assembly at the predetermined desired frequency of said oscillator, a mixer crystal coupled to one of said two asymmetrical branches, and a modulator crystal coupled to the other of said two asymmetrical branches; means for applying output energy from said oscillator to said one asymmetrical branch and to the mixer crystal coupled thereto, means coupled to said modulator crystal for modulating the energy from said oscillator appearing thereat, thereby to produce sideband energy, said mixer crystal operating to develop beat frequency energy by mixing of said sideband energy and energy from said oscillator; means for developing a frequency control voltage from said beat frequency energy, and means for applying said control voltage to said oscillator for control purposes.

2. In an oscillator frequency control system, an oscillator the frequency of which is to be controlled, an impedance bridge type frequency discriminator comprising a magic-T assembly having two symmetrical waveguide branches and two asymmetrical waveguide branches, a passive wave impedance element terminating one of said two symmetrical branches, a cavity resonator coupled to the other of said two symmetrical branches, said cavity resonator being matched to said assembly at the predetermined desired frequency of said oscillator, a mixer crystal coupled to one of said two asymmetrical branches, and a modulator crystal coupled to the other of said two asymmetrical branches; means for applying output energy from said oscillator to said one asymmetrical branch and to the mixer crystal coupled thereto, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

3. In an oscillator frequency control system, an oscillator the frequency of which is to be controlled, an impedance bridge type frequency discriminator comprising a magic-T assembly having two symmetrical waveguide branches and two asymmetrical waveguide branches, a passive wave impedance element terminating one of said two symmetrical branches, a cavity resonator coupled to the other of said two symmetrical branches, said resonator being matched to said assembly at the predetermined desired frequency of said oscillator, a mixer crystal coupled to one of said two asymmetrical branches, and a modulator crystal terminating the other of said two asymmetrical branches; means for applying output energy from said oscillator to said one asymmetrical branch and to the mixer crystal coupled thereto, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

4. In an oscillator frequency control system, an oscillator the frequency of which is to be controlled, an impedance bridge type frequency discriminator comprising a magic-T assembly having two symmetrical waveguide branches and two asymmetrical waveguide branches, a passive wave impedance element terminating one of said two symmetrical branches, a cavity resonator coupled to the other of said two symmetrical branches, said resonator being matched to said assembly at the predetermined desired frequency of said oscillator, a mixer crystal coupled to one of said two asymmetrical branches, and a modulator crystal coupled to the other of said two asymmetrical branches; means for applying output energy from said oscillator to said one asymmetrical branch and to the mixer crystal coupled thereto, a phase detector having two inputs and an output, an oscillator having a portion of its output coupled to said modulator crystal and another portion coupled to one of said detector inputs, an amplifier tuned to the frequency of said last-mentioned oscillator coupled between the output of said mixer crystal and the other of said detector inputs, and means for utilizing the output of said detector as a frequency control voltage for said first-mentioned oscillator.

5. In an oscillator frequency control system, an oscillator the frequency of which is to be controlled, an impedance bridge type frequency discriminator comprising a magic-T assembly having two symmetrical waveguide branches and two asymmetrical waveguide branches, a passive wave impedance element terminating one of said two symmetrical branches, a cavity resonator coupled to the other of said two symmetrical branches, said resonator being matched to said assembly at the predetermined desired frequency of said oscillator, a mixer crystal coupled to one of said two asymmetrical branches, and a modulator crystal coupled to the other of said two asymmetrical branches; means for applying output energy from said oscillator to said one asymmetrical branch and to the mixer crystal coupled thereto, a phase detector having two inputs and an output, means coupling the output of said mixer crystal to one of said detector inputs, an oscillator having a portion of its output coupled to said modulator crystal and another portion coupled to the other of said detector inputs, said last-mentioned oscillator having a frequency which is low as compared to said predetermined frequency, and means for utilizing the output of said detector as a frequency control voltage for said first-mentioned oscillator.

6. In an oscillator frequency control system, an oscillator the frequency of which is to be controlled, an impedance bridge type frequency discriminator comprising a magic-T assembly having two symmetrical waveguide branches and two asymmetrical waveguide branches, a passive wave impedance element terminating one of said two symmetrical branches, a cavity resonator coupled to the other of said two symmetrical branches, said resonator being matched to said assembly at the predetermined desired frequency of said oscillator, a mixer crystal coupled to one of said two asymmetrical branches, and a modulator crystal coupled to the other of said two asymmetrical branches; means for applying output energy from said oscillator to said one asymmetrical branch and to the mixer crystal coupled thereto, a phase detector having two inputs and an output, an oscillator having a portion of its output coupled to said modulator crystal and another portion coupled to one of said detector inputs, said last-mentioned oscillator having a frequency which is low as compared to said predetermined frequency, an amplifier tuned to the frequency of said last-mentioned oscillator coupled between the output of said mixer crystal and the other of said detector inputs, and means for utilizing the output of said detector as a frequency control voltage for said first-mentioned oscillator.

7. In an oscillator frequency control system, an oscillator the frequency of which is to be controlled, an impedance bridge type frequency discriminator comprising a magic-T assembly having two symmetrical waveguide branches and two asymmetrical waveguide branches, a passive wave impedance element terminating one of said two symmetrical branches, a cavity resonator coupled to the other of said two symmetrical branches, said resonator being matched to said assembly at the predetermined desired frequency of said oscillator, a mixer crystal coupled to one of said two asymmetrical branches, and a modulator crystal terminating the other of said two asymmetrical branches; means for applying output energy from said oscillator to said one asymmetrical branch and to the mixer crystal coupled thereto, a phase detector having two inputs and an output, an oscillator having a portion of its output coupled to said modulator crystal and another portion coupled to one of said detector inputs, an amplifier tuned to the frequency of said last-mentioned oscillator coupled between the output of said mixer crystal and the other of said detector inputs, and means for utilizing the output of said detector as a frequency control voltage for said first-mentioned oscillator.

8. In an oscillator frequency control system, an oscillator the frequency of which is to be controlled, a first magic-T assembly having two symmetrical waveguide branches and two asymmetrical waveguide branches, means coupling at least a portion of the output of said oscillator into one of said two asymmetrical branches, a mixer crystal coupled to the other asymmetrical branch, a second magic-T assembly having two symmetrical waveguide branches and two asymmetrical waveguide branches, one of the symmetrical branches of said first assembly being coupled to one of the two asymmetrical branches of said second assembly, a wave impedance terminating one of the two symmetrical branches of said second assembly, a cavity resonator coupled to the other symmetrical branch of said second assembly, said resonator being matched to said second assembly at the predetermined desired frequency of said oscillator, a modulator crystal coupled to the other asymmetrical branch of said second assembly, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

9. In an oscillator frequency control system, an oscillator the frequency of which is to be controlled, a first magic-T assembly having two symmetrical waveguide branches, and two asymmetrical waveguide branches, means coupling at least a portion of the output of said oscillator into one of said two asymmetrical branches, a mixer crystal coupled to the other asymmetrical branch, a wave impedance coupled to one of said two symmetrical branches, said impedance being mismatched to said one symmetrical branch, a second magic-T assembly having two symmetrical waveguide branches and two asymmetrical waveguide branches, the other symmetrical branch of said first assembly being coupled to one of the two asymmetrical branches of said second assembly, a wave impedance terminating one of the two symmetrical branches of said second assembly, a cavity resonator coupled to the other symmetrical branch of said second assembly, said resonator being matched to said second assembly at the predetermined desired frequency of said oscillator, a modulator crystal coupled to the other asymmetrical branch of said second assembly, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

10. In an oscillator frequency control system, an oscillator the frequency of which is to be controlled, a first magic-T assembly having two symmetrical waveguide branches and two asymmetrical waveguide branches, means coupling at least a portion of the output of said oscillator into one of said two asymmetrical branches, a mixer crystal coupled to the other asymmetrical branch, a wave impedance coupled to one of said two symmetrical branches, means for adjusting the effective value of said impedance, a second magic-T assembly having two symmetrical waveguide branches and two asymmetrical waveguide branches, the other symmetrical branch of said first assembly being coupled to one of the two asymmetrical branches of said second assembly, a wave impedance terminating one of the two symmetrical branches of said second assembly, a cavity resonator coupled to the other symmetrical branch of said second assembly, said resonator being matched to said second assembly at the predetermined desired frequency of said oscillator, a modulator crystal coupled to the other asymmetrical branch of said second assembly, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

11. In a frequency control system for a microwave oscillator, a microwave oscillator the frequency of which is to be controlled, a first magic-T assembly having two symmetrical waveguide branches and two asymmetrical waveguide branches, means coupling at least a portion of the output of said oscillator into one of said two asymmetrical branches, a mixer crystal coupled to the other asymmetrical branch, a second magic-T assembly having two symmetrical waveguide branches and two asymmetrical waveguide branches, one of the symmetrical branches of said first assembly being coupled to one of the two asymmetrical branches of said second assembly, a wave impedance terminating one of the two symmetrical branches of said second assembly, a cavity resonator coupled to the other symmetrical branch of said second assembly, said resonator being matched to said second assembly at the predetermined desired frequency of said oscillator, a modulator crystal coupled to the other asymmetrical branch of said second assembly, said modulator crystal having a variable impedance, a phase detector having two inputs and an output, means coupling the output of said mixer crystal to one of said detector inputs, a modulation frequency oscillator having a portion of its output coupled to said modulator crystal and another portion coupled to the other of said detector inputs, and means for utilizing the output of said detector as a frequency control voltage for said microwave oscillator.

12. In a frequency control system for a microwave oscillator, a microwave oscillator the frequency of which is to be controlled, a first magic-T assembly having two symmetrical waveguide branches and two asymmetrical waveguide branches, means coupling at least a portion of the output of said oscillator into one of said two asymmetrical branches, a mixer crystal coupled to the other asymmetrical branch, a wave impedance coupled to one of said two symmetrical branches, said impedance being mismatched to said one symmetrical branch, a second magic-T assembly having two symmetrical waveguide branches and two asymmetrical waveguide branches, the other symmetrical branch of said first assembly being coupled to one of the two asymmetrical branches of said second assembly, a wave impedance terminating one of the two symmetrical branches of said second assembly, a cavity resonator coupled to the other symmetrical branch of said second assembly, said resonator being matched to said second assembly at the predetermined desired frequency of said oscillator, a modulator crystal coupled to the other asymmetrical branch of said second assembly, said modulator crystal having a variable impedance, a phase detector having two inputs and an output, means coupling the output of said mixer crystal to one of said detector inputs, a modulation frequency oscillator having a portion of its output coupled to said modulator crystal and another portion coupled to the other of said detector inputs, and means for utilizing the output of said detector as a frequency control voltage for said microwave oscillator.

13. In a frequency control system for a microwave oscillator, a microwave oscillator the frequency of which is to be controlled, a first magic-T assembly having two symmetrical waveguide branches and two asymmetrical waveguide branches, means coupling at least a portion of the output of said oscillator into one of said two asymmetrical branches, a mixer crystal coupled to the other asymmetrical branch, a wave impedance coupled to one of said two symmetrical branches, means for adjusting the effective value of said impedance, a second magic-T assembly having two symmetrical waveguide branches and two asymmetrical waveguide branches, the other symmetrical branch of said first assembly being coupled to one of the two asymmetrical branches of said second assembly, a wave impedance terminating one of the two symmetrical branches of said second assembly, a cavity resonator coupled to the other symmetrical branch of said second assembly, said resonator being matched to said second assembly at the predetermined desired frequency of said oscillator, a modulator crystal coupled to the other asymmetrical branch of said second assembly, said modulator crystal having a variable impedance, a phase detector having two inputs and an output, means coupling the output of said mixer crystal to one of said detector inputs, a modulation frequency oscillator having a portion of its output coupled to said modulator crystal and another portion coupled to the other of said detector inputs, and means for utilizing the output of said detector as a frequnecy control voltage for said microwave oscillator.

14. In an oscillator frequency control system, an oscillator the frequency of which is to be controlled, a first magic-T assembly having two symmetrical waveguide branches and two asymmetrical waveguide branches, means coupling the output of said oscillator into one of said two asymmetrical branches, a mixer crystal coupled to the other asymmetrical branch, a second magic-T assembly having two symmetrical waveguide branches and two asymmetrical waveguide branches, one of the symmetrical branches of said first assembly being coupled to one of the two asymmetrical branches of said second assembly, a wave impedance terminating one of the two symmetrical branches of said second assembly, a cavity resonator coupled to the other symmetrical branch of said second assembly, said resonator being matched to said second assembly at the predetermined desired frequency of said oscillator, a modulator crystal coupled to the other asymmetrical branch of said second assembly, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

15. In an oscillator frequency control system, an oscillator the frequency of which is to be controlled, a first magic-T assembly having two symmetrical waveguide branches and two asymmetrical waveguide branches, means coupling the output of said oscillator into one of said two asymmetrical branches, a mixer crystal coupled to the other asymmetrical branch, a useful load coupled to one of said two symmetrical branches, said load being mismatched to said one symmetrical branch, a second magic-T assembly having two symmetrical waveguide branches and two asymmetrical waveguide branches, the other symmetrical branch of said first assembly being coupled to one of the two asymmetrical branches of said second assembly, a wave impedance terminating one of the two symmetrical branches of said second assembly, a cavity resonator coupled to the other symmetrical branch of said second assembly, said resonator being matched to said second assembly at the predetermined desired frequency of said oscillator, a modulator crystal coupled to the other asymmetrical branch of said second assembly, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

16. In an oscillator frequency control system, an oscillator the frequency of which is to be controlled, a first magic-T assembly having two symmetrical waveguide branches and two asymmetrical waveguide branches, means coupling the output of said oscillator into one of said two asymmetrical branches, a mixer crystal coupled to the other asymmetrical branch, a useful load coupled to one of said two symmetrical branches, means for adjusting the effective value of the impedance presented by said load, a second magic-T assembly having two symmetrical waveguide branches and two asymmetrical waveguide branches, the other symmetrical branch of said first assembly being coupled to one of the two asymmetrical branches of said second assembly, a wave impedance terminating one of the two symmetrical branches of said second assembly, a cavity resonator coupled to the other symmetrical branch of said second assembly, said resonator being matched to said second assembly at the predetermined desired frequency of said oscillator, a modulator crystal coupled to the other asymmetrical branch of said second assembly, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

17. In an oscillator frequency control system, an oscillator the frequency of which is to be controlled, a first magic-T assembly having two symmetrical waveguide branches and two asymmetrical waveguide branches, means coupling the output of said oscillator into one of said two asymmetrical branches, a second magic-T assembly having two symmetrical waveguide branches and two asymmetrical waveguide branches, one of the symmetrical branches of said first assembly being coupled to one of the two asymmetrical branches of said second assembly, a mixer crystal coupled to the other asymmetrical branch of said second assembly, a third magic-T assembly having two symmetrical waveguide branches and two asymmetrical waveguide branches, one of the symmetrical branches of said second assembly being coupled to one of the two asymmetrical branches of said third assembly, a wave impedance terminating one of the two symmetrical branches of said third assembly, a cavity resonator coupled to the other symmetrical branch of said third assembly, said resonator being matched to said third assembly at the predetermined desired frequency of said oscillator, a modulator crystal coupled to the other asymmetrical branch of said third assembly, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

18. In an oscillator frequency control system, an oscillator the frequency of which is to be controlled, a first magic-T assembly having two symmetrical waveguide branches and two asymmetrical waveguide branches, means coupling the output of said oscillator into one of said two asymmetrical branches, a second magic-T assembly having two symmetrical waveguide branches and two asymmetrical waveguide branches, one of the symmetrical branches of said first assembly being coupled to one of the two asymmetrical branches of said second assembly, a mixer crystal coupled to the other asymmetrical branch of said second assembly, a wave impedance coupled to one of said two symmetrical branches of said second assembly, said impedance being mismatched to said last one symmetrical branch, a third magic-T assembly having two symmetrical waveguide branches and two asymmetrical waveguide branches, the other symmetrical branch of said second assembly being coupled to one of the two asymmetrical branches of said third assembly, a wave impedance terminating one of the two symmetrical branches of said third assembly, a cavity resonator coupled to the other symmetrical branch of said third assembly, said resonator being matched to said third assembly at the predetermined desired frequency of said oscillator, a modulator crystal coupled to the other asymmetrical branch of said third assembly, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

19. In an oscillator frequency control system, an oscillator the frequency of which is to be controlled, a first magic-T assembly having two symmetrical waveguide branches and two asymmetrical waveguide branches, means coupling the output of said oscillator into one of said two asymmetrical branches, a second magic-T assembly having two symmetrical branches, a second magic- T assembly having two symmetrical waveguide branches and two asymmetrical waveguide branches, one of the symmetrical branches of said first assembly being coupled to one of the two asymmetrical branches of said second assembly, a mixer crystal coupled to the other asymmetrical branch of said second assembly, a wave impedance coupled to one of said two symmetrical branches of said second assembly, means for adjusting the effective value of said impedance, a third magic-T assembly having two symmetrical waveguide branches and two asymmetrical waveguide branches, the other symmetrical branch of said second assembly being coupled to one of the two asymmetrical branches of said third assembly, a wave impedance terminating one of the two symmetrical branches of said third assembly, a cavity resonator coupled to the other symmetrical branch of said third assembly, said resonator being matched to said third assembly at the predetermined desired frequency of said oscillator, a modulator crystal coupled to the other asymmetrical branch of said third assembly, a phase detector having two inputs and an output, means coupling the output of said mixer crystal to one of said detector inputs, an oscillator having a portion of its output coupled to said modulator crystal and another portion coupled to the other of said detector inputs, and means for utilizing the output of said detector as a frequency control voltage for said first-mentioned oscillator.

20. In a frequency control system for a microwave oscillator, a microwave oscillator the frequency of which is to be controlled, a first magic-T assembly having two symmetrical waveguide branches and two asymmetrical waveguide branches, means coupling the output of said oscillator into one of said two asymmetrical branches, a mixer crystal coupled to the other asymmetrical branch, a second magic-T assembly having two symmetrical waveguide branches and two asymmetrical waveguide branches, one of the symmetrical branches of said first assembly being coupled to one of the two asymmetrical branches of said second assembly, a wave impedance terminating one of the two symmetrical branches of said second assembly, a cavity resonator coupled to the other symmetrical branch of said second assembly, said resonator being matched to said second assembly at the predetermined desired frequency of said oscillator, a modulator crystal coupled to the other asymmetrical branch of said second assembly, said modulator crystal having a variable impedance, a phase detector having two inputs and output, means coupling the output of said mixer crystal to one of said detector inputs, a modulation frequency oscillator having a portion of its output coupled to said modulator crystal and another portion coupled to the other of said detector inputs, and means for utilizing the output of said detector as a frequency control voltage for said microwave oscillator.

No references cited.